United States Patent [19]

Hirtz

[11] 4,217,597
[45] Aug. 12, 1980

[54] DIODE WHICH TRANSMITS AND RECEIVES LIGHT-RAYS OF THE SAME PREDETERMINED WAVELENGTH AND OPTICAL TELECOMMUNICATIONS DEVICE USING SUCH A DIODE

[75] Inventor: Pierre Hirtz, Paris, France
[73] Assignee: Thomson-CSF, Paris, France
[21] Appl. No.: 957,196
[22] Filed: Nov. 2, 1978

[30] Foreign Application Priority Data

Nov. 7, 1977 [FR] France .............................. 77 33354

[51] Int. Cl.² .................. H01L 31/12; H01L 33/00; H01L 29/161
[52] U.S. Cl. .................................. 357/19; 357/30; 357/17; 357/16; 357/81
[58] Field of Search .................. 357/17, 18, 19, 30, 357/81, 16

[56] References Cited

U.S. PATENT DOCUMENTS

| | | | |
|---|---|---|---|
| 3,852,798 | 12/1974 | Leabailly | 357/19 |
| 3,946,334 | 3/1976 | Yonezu | 331/94.54 |
| 4,025,939 | 5/1977 | Aiki | 357/18 |

*Primary Examiner*—Martin H. Edlow
*Attorney, Agent, or Firm*—Cushman, Darby & Cushman

[57] ABSTRACT

The invention relates to a diode which transmits and receives light-rays in the same wavelength. A first transmitting layer is separated from the second receiving layer, and has the opposite type of conductivity to that of the first, this layer having a large forbidden bandwidth, the functions of transmission and reception being thus separated from one another. The invention is applicable to a system of telecommunication by optical fibers.

5 Claims, 10 Drawing Figures

DIODE WHICH TRANSMITS AND RECEIVES LIGHT-RAYS OF THE SAME PREDETERMINED WAVELENGTH AND OPTICAL TELECOMMUNICATIONS DEVICE USING SUCH A DIODE

The present invention relates to a diode which emits and receives light-rays of the same predetermined wavelength.

It is known that electroluminescent or light emissive diodes are used more particularly in the field of telecommunications by optical fibers and that said diodes, when forward-biased, emit light-rays. These rays carry information. Upon reception, a reverse-biassed diode delivers an electric current which is a function of the intensity of the light-rays.

Attempts have already been made to use the same diode in order to carry out the two functions alternately. This problem is difficult to solve, the properties required in the two functions conflicting in certain points if optimum efficiencies are desired in light emission and reception.

In fact, the emitting zone must be thin in order not to absorb the photons which it generates. It must be strongly doped in order to have a sufficiently short response time. On the contrary, the receiving zone must be fairly thick in order to absorb the photons and consequently produce an electric current, and must be fairly weakly doped in order to be at least partly in space charge at the reverse bias voltage. In addition, these two layers must have forbidden bands of different widths. It will be seen that these conditions conflict. The diode according to the invention which emits and receives light enables this problem to be solved. The transmitting and receiving diode according to the invention is essentially characterised by the superposition of a first emitting layer having a first type of conductivity and a second detecting layer having a second type of conductivity opposite to the first, the forbidden bandwidth of the detecting layer being less than that of the emitting layer, a third layer having a bandwidth substantially greater than that of the first and second layers being interposed between them.

The invention will be better understood by means of the following description with reference to the appended drawings, wherein.

FIGS. 6, 7, 8, 9 and 10 respectively illustrate in section some examples of embodiment of the invention.

Figure 1:
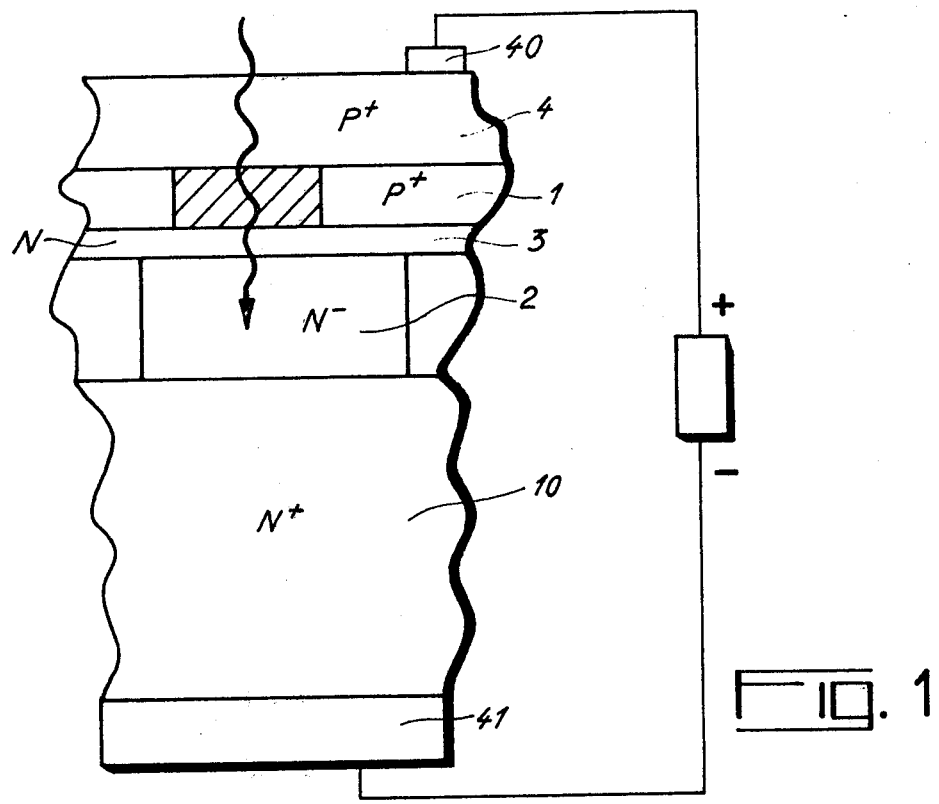
FIG. 1 illustrates very diagrammatically a first example of a diode according to the invention.

In FIG. 1, four layers of different chemical composition, and consequently of different forbidden bands, have been deposited on a substrate 10 of N+ type, that is to say in order the layer 2 of N−type, 3 of N or N type, 1 of P+ type and 4 likewise of P+ type. The layer 4, which is of the order of 1 μm thick, is exposed to the light-rays which the diode has to detect when it is reverse-biassed, and it is from this face that the light-rays are emitted, substantially on the same wavelength, when it is forward-biassed. By way of non-limitative example, the substrate and the layer 2 are made of gallium arsenide GaAs, and the layers 1, 2, 3 and 4 of $Ga_{1-x}Al_xAs$ alloy, the value of x being different for each layer.

The layer 4 has a very large forbidden band of the order of 1.8 eV of the order of 1 μm thick, the layer 1 a smaller forbidden band of the order of 1.5 eV, the layer 3 of the order of 0.3 μm thick has a much larger forbidden band 1.8 eV, for example the layer 2 of the order of 2 μm thick has the smallest forbidden band, 1.4 eV, and finally the substrate has a forbidden band of the order of 1.4 eV and a thickness of 10 to 200 μm.

Figure 2:
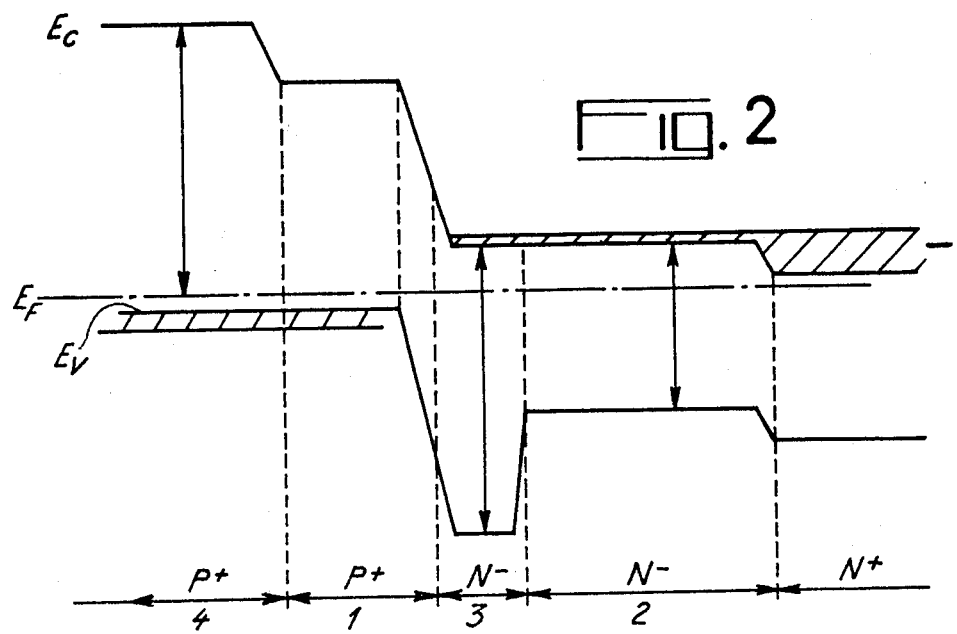
FIG. 2 illustrates the energy levels at rest in such a diode.

FIG. 2 illustrates in a state of rest, that is to say without external bias, the energy levels $E_v$ and $E_c$ of the conduction bands and the valency bands of the various regions.

In this figure, the broken line illustrates the Fermi level. It will be clearly seen that zone 3 inserted between zones 1 and 2 defines a potential barrier with zone 1. The energy levels occupied in the valency bands of the regions 1 and 4 correspond to P type doping.

Likewise, the energy levels occupied in the conduction band of zones 3 and 2 correspond to N type doping. Since these energy levels are occupied only on either side of the junction, no electric current will flow.

Figure 3:
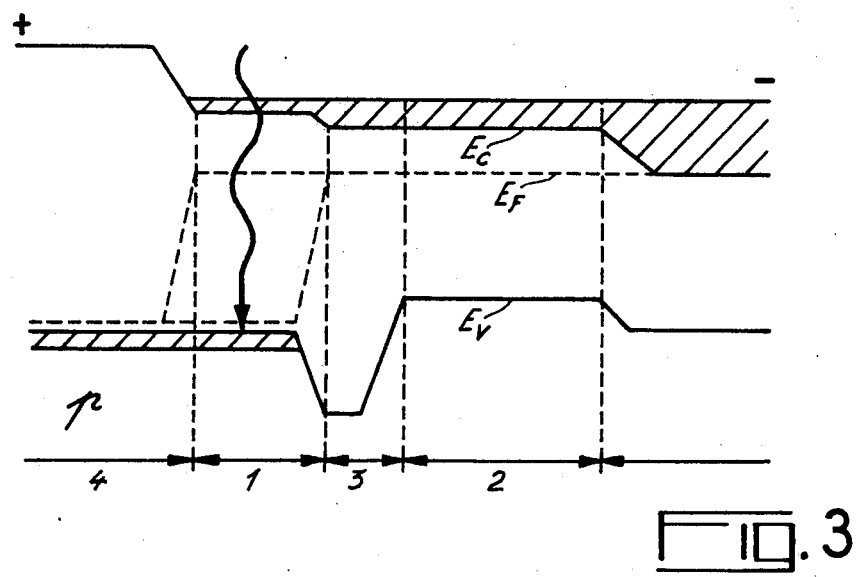
FIG. 3 illustrates the energy levels of the same diode with forward bias.

FIG. 3 illustrates the energy levels in the same manner with forward bias.

It will be clearly seen in this figure that there are excess holes and electrons in zone 1, in the valency and conduction bands respectively at the same time. By recombining, these holes and electrons give rise to the phenomenon of electroluminescence by creating photons. The holes cannot pass the barrier formed by the valency band in zone 3, and the electrons cannot pass the barrier formed by the conduction band in zone 4. The frequency of the radiation is proportional to the width of the forbidden band in zone 1. The thickness of zone 1, of the order of 1 μm, and its doping, of the order of $10^{18}$ at/cm$^3$ are chosen in optimum fashion, so that the photoemissive efficiency and modulation velocity of the diode are as great as possible.

Figure 4:
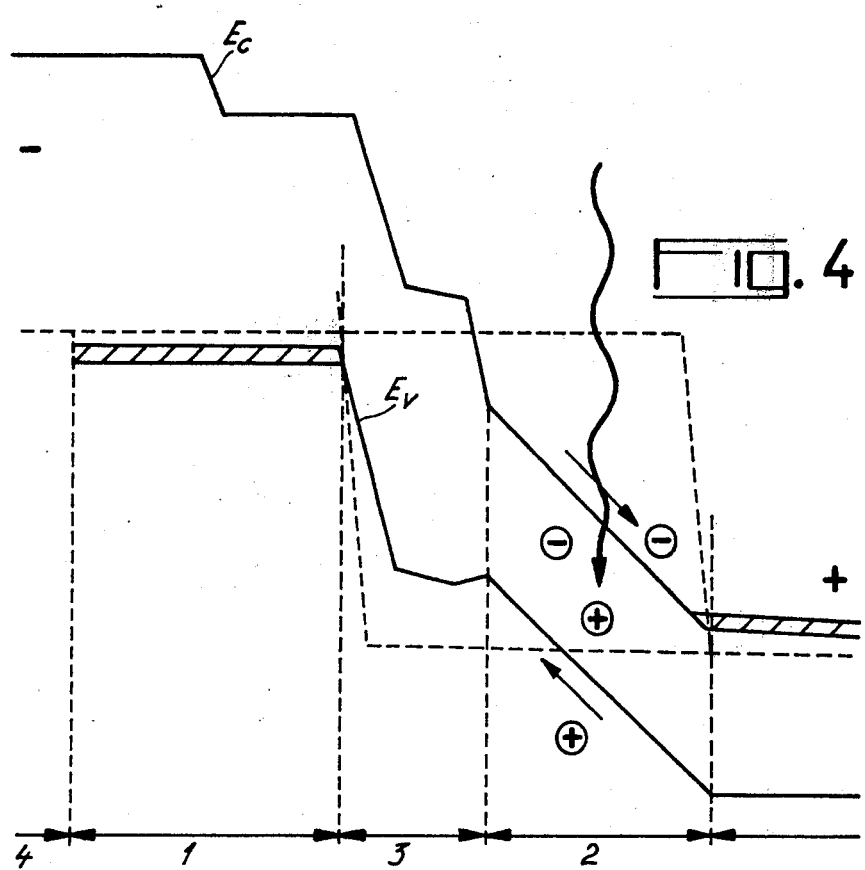
FIG. 4 illustrates the energy levels of the same diode 15 under reverse-bias conditions.

In FIG. 4, the energy levels $E_v$ and $E_c$ are illustrated in the case of high reverse bias; zone 4 is connected to the negative pole of a d.c supply, and the substrate to its positive pole. It follows therefrom that the potential barriers are accentuated in the vicinity of the junction, and that zones 3 and 2 are in space charge. A photon passing through zones 4, 1 and 3 without being absorbed by reason of their relatively large respective forbidden bandwidths is absorbed in zone 2 of smaller forbidden bandwidth. Each photon gives rise to one hole which goes towards the negative pole, and an electron which goes towards the positive pole. It is therefore in zone 2 where photodetection essentially takes place. This zone may therefore be sufficiently thick, 2 μm for example, to absorb the photons and weakly doped $10^{15}$ at/cm$^3$ for example, in order to be easily placed in space charge. The purpose of zone 3 is to form the potential barriers required in order to separate the two functions: photoemission and photodetection. Its thickness may be small 0.3 μm for example. It is essentially its forbidden bandwidth which must be large, and its doping must be sufficiently weak for the space charge to extend into the layer 2.

Figure 5:
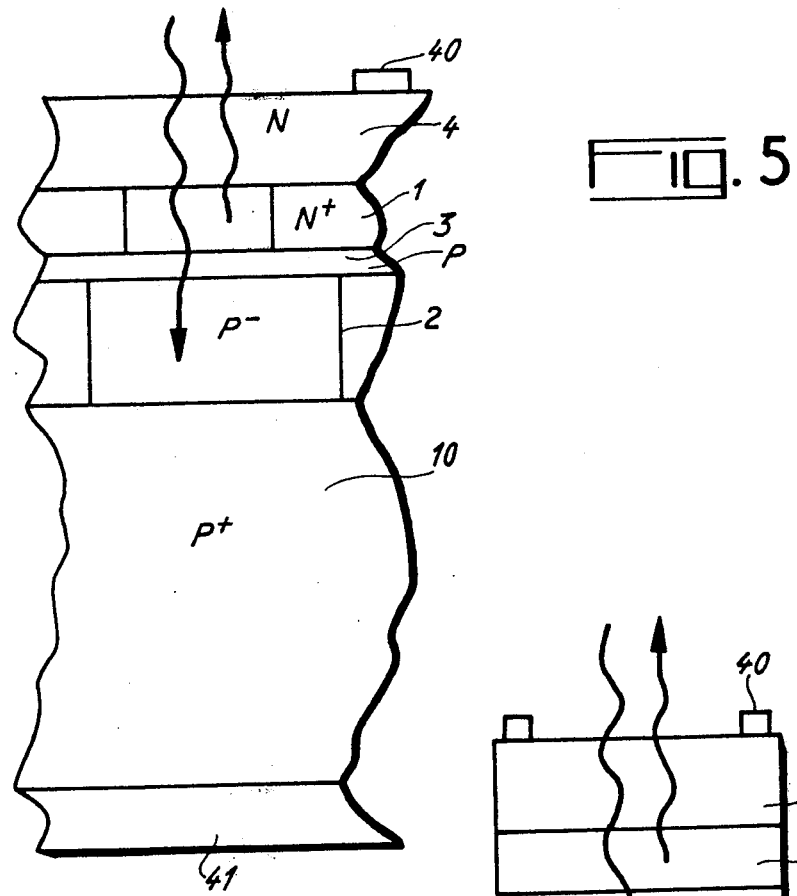

FIG. 5 illustrates a diode according to the invention wherein the types of conductivity have been reversed, with respect to that of the preceding one, the sires and the doping concentration being otherwise identical.

Figure 6:
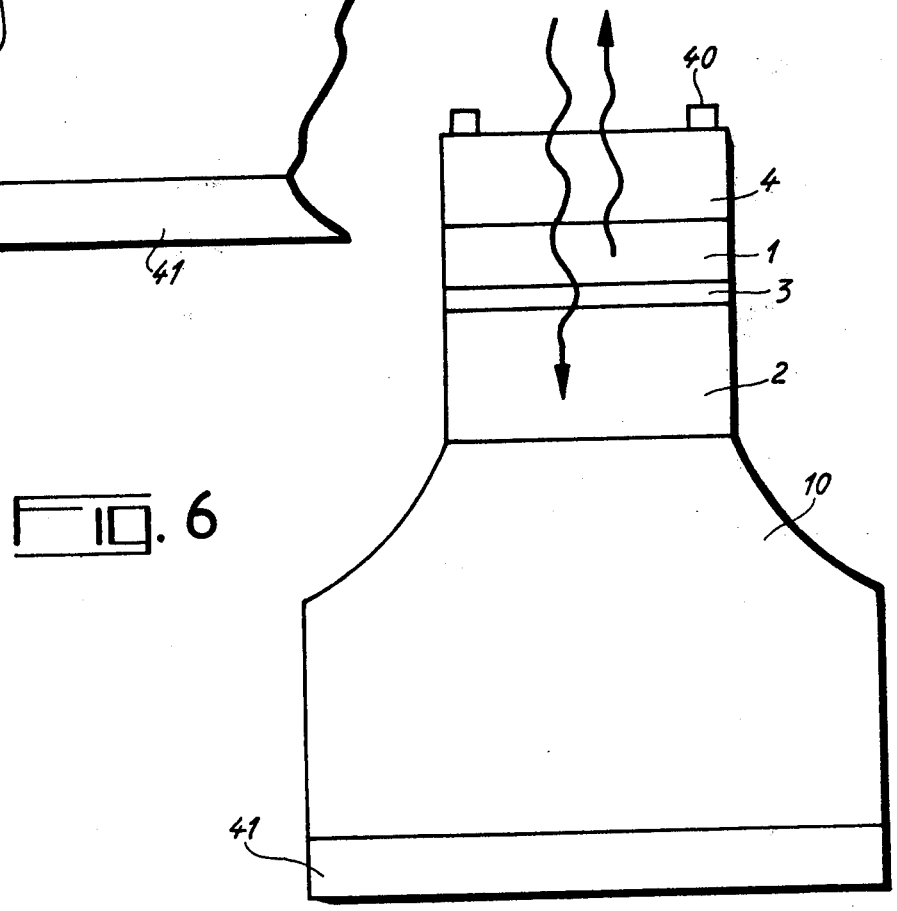

FIG. 6 illustrates an example of embodiment in the form of a "mesa", zone 4 exposed to the light-radiation carrying an annular contact 40. The substrate 10 carries a contact 41 on its free surface.

Figure 7:
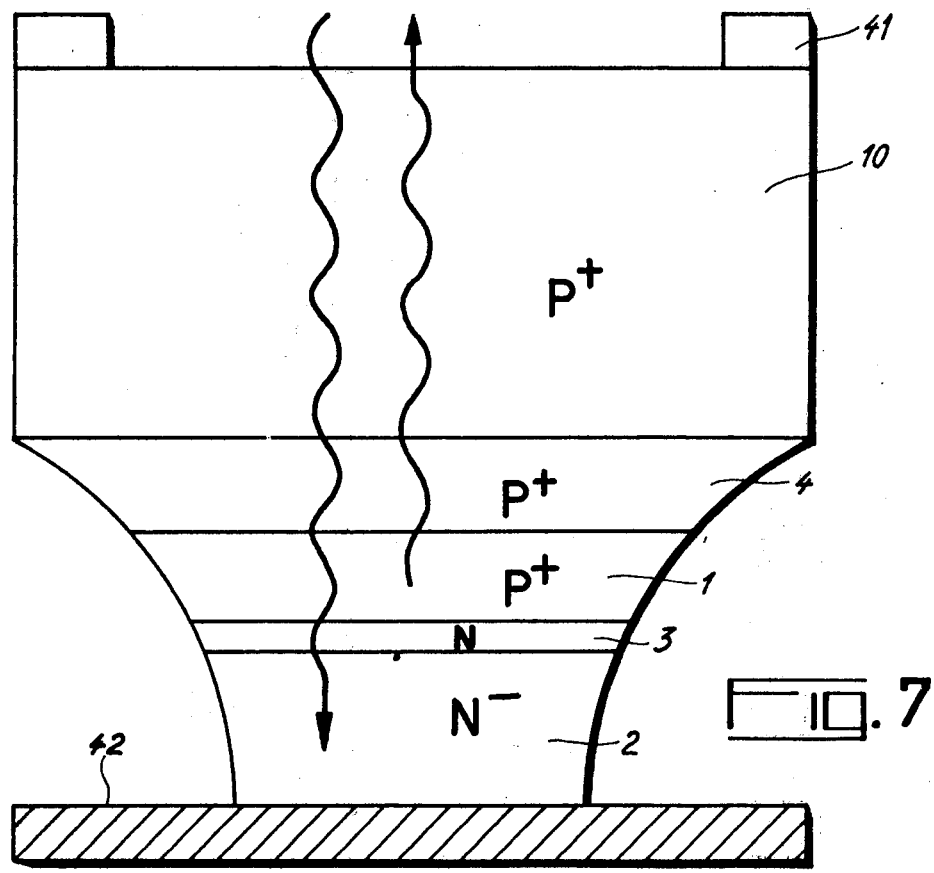

Another example of embodiment of the invention is illustrated in FIG. 7. The substrate 10 is transparent and its free face is exposed to the light radiation and carries an annular contact 41. The arrangement of the layers 1, 2, 3 and 4 is reversed with respect to the foregoing figures and the conductivity type of the substrate must obviously be reversed also. The layer 2 is soldered to a metal support 42, which serves both as a heat-sink and as a contact: this arrangement improves heat-dissipation. The diode is of the so-called "flip-chip bonded" type.

Figure 8:
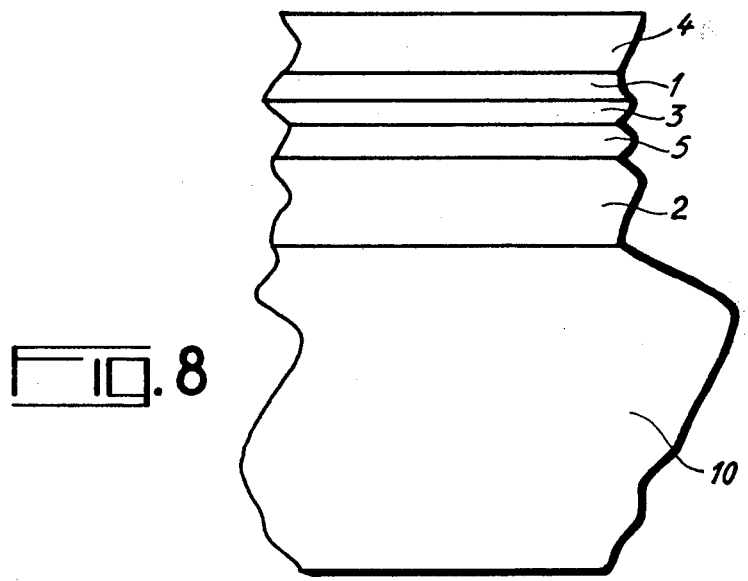

In FIG. 8 an N type layer 5 having a small forbidden band is interposed between zones 2 and 3, and may serve as an avalanche-multiplier layer for the electrons generated in the layer 2. The same result could be obtained by doping the layer 3 more strongly than the layer 2, and as a consequence the avalanche phenomenon could occur in the layer 3. Should the doping become excessive, it may be difficult to place the layers 2 and 3 in space charge. The presence of the layer 5 in FIG. 8 enables this problem to be solved.

It may be noted that in the case of an alloy of the $Ga_{1-x}Al_xAs$ type the width of the forbidden band is an increasing function of the value of x. In the examples described above, the layers 1, 2, 3 and 4 will have for example values of x of 0.07 for the layer 1, in the vicinity of 0 for the layer 2, and 0.3 for the layers 3 and 4. It may be hoped that an anti-reflective treatment, that is to say depositing a quarter-wave dielectric layer of known type on the free surface of the diode (zone 4 or substrate), will give a sensitivity in the region of 100 A per watt.

The response time on reception may be short since all the carriers are created in the space-charge zone; therefore no natural diffusion process intervenes. Finally, the transit time of the carriers created in the space-charge zone having a thickness of the order of 2 μm may be less than 100 ps.

All the values indicated are naturally given by way of example. In addition, materials other than alloys of the Ga, Al, As type may be used, for example structures based on ternary or quaternary mixtures, taken from groups 3 and 5 of Mendeleev's classification.

Figure 9:
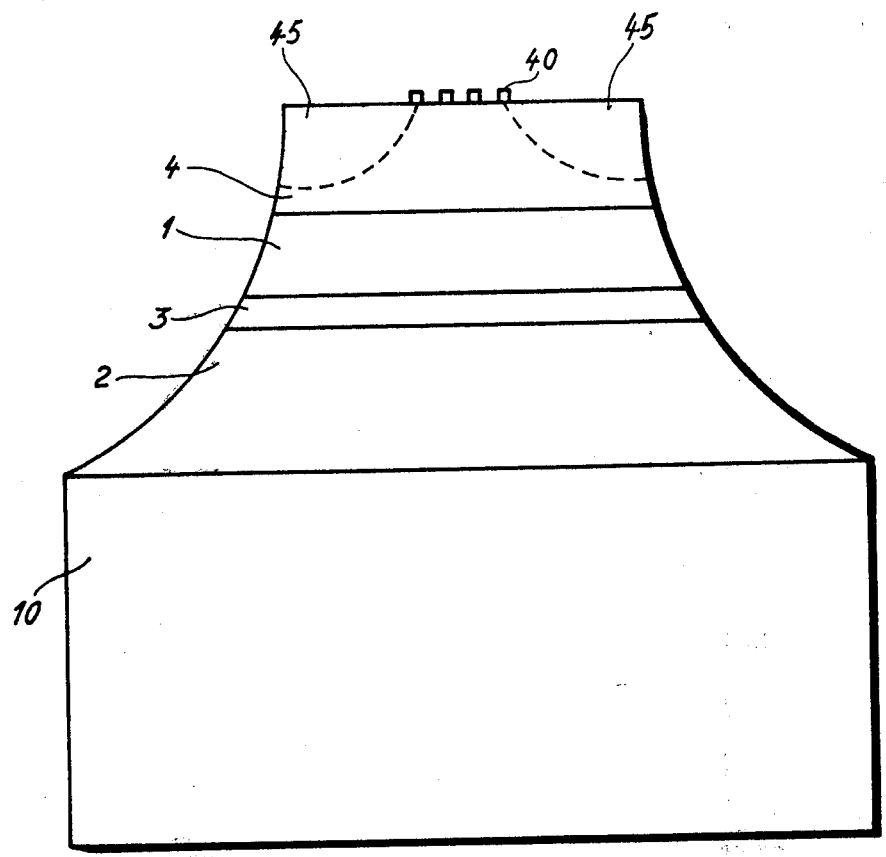

Finally, FIG. 9 illustrates a structure combining the solution described in this application and in the French patent application filed on Oct. 18, 1977 under No. 77 31 274. The layer 4 is provided with an annular insulating zone 45 which enables the current lines in the central part of the diode to be concentrated on transmission.

Figure 10:
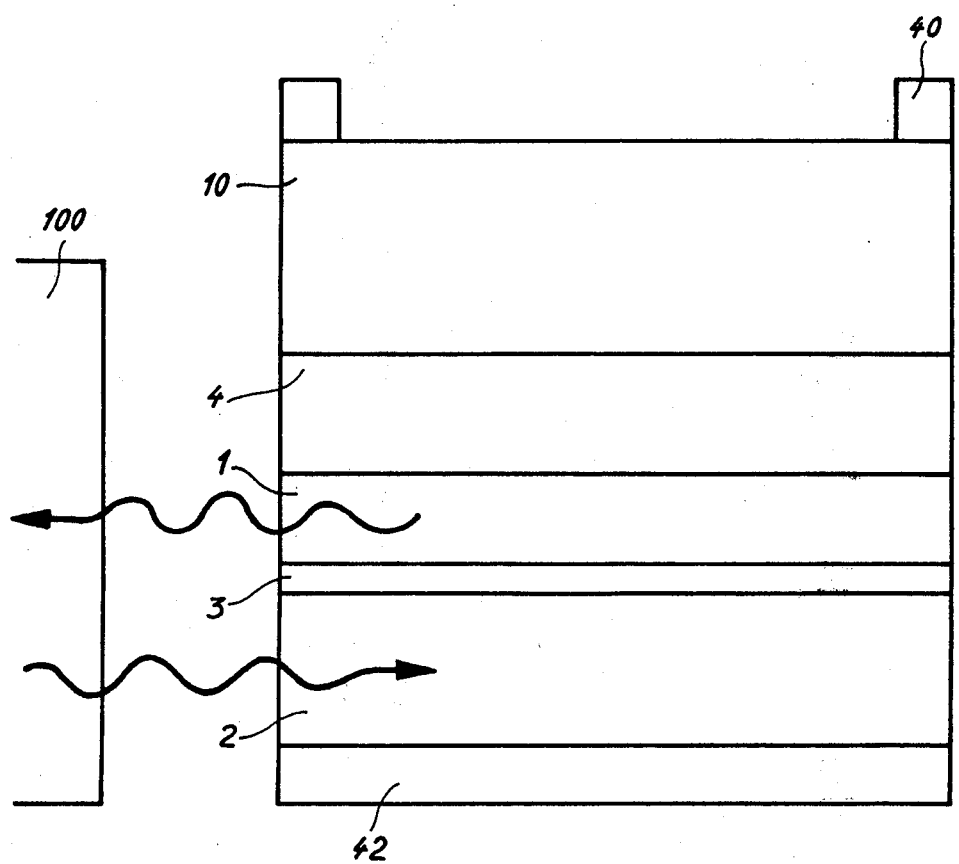

The invention may also be extended to laser semiconductor structure, FIG. 10. In this case, the whole is a monocrystal cleaved on two lateral faces. The optical fibre 100 is coupled in the manner indicated, the layers 2 and 1 respectively receiving and transmitting the light radiated by one on the cleaved faces, as indicated.

What I claim is:

1. Diode capable of emitting and receiving light-rays of a predetermined wavelength, comprising:
   a semiconductor substrate of a first conductivity type, having a surface;
   a photoreceptive semiconductor layer of said first conductivity type, having a forbidden bandwidth $E_1$, said photoreceptive layer being disposed on said surface;
   an optical confinement semiconductor layer of said first conductivity type, having a forbidden bandwidth $E_3$, said optical confinement layer being disposed on said photoreceptive layer;
   a photoemissive semiconductor layer of a second conductivity type, opposite said first conductivity type, having forbidden bandwidth $E_2$, said photoemissive layer being disposed on said optical confinement layer;
   another semiconductor layer of said second conductivity type having a forbidden bandwidth $E_4$, said another layer being disposed on said photoemissive layer, said forbidden bandwidths satisfy the following relationship:

$$E_1 < E_2 < E_3 \leq E_4.$$

2. Diode capable of emitting and receiving light-rays of a predetermined wavelength, comprising:
   a semiconductor substrate of a first conductivity type, having a surface;
   a first semiconductor layer of said first conductivity type disposed on said surface and having a forbidden bandwidth $E_4$;
   a photoemissive semiconductor layer of said first conductivity type, having a forbidden bandwidth $E_2$, said photoemissive layer being disposed on said first layer;
   an optical confinement semiconductor layer of a second conductivity type opposite said first conductivity type having a forbidden bandwidth $E_3$, said photoemissive layer being disposed on said photoemissive layer;
   a photoreceptive semiconductor layer of said second conductivity type, having a forbidden bandwidth $E_1$, said photoreceptive layer being disposed on said optical confinement layer, said forbidden bandwidths satisfy the relationship:

$$E_1 < E_2 < E_3 \leq E_4.$$

3. Diode as claimed in claim 1, wherein:
$E_1 = 1.4$ eV
$E_2 = 1.5$ eV
$E_3 = E_4 = 1.8$ eV.

4. Diode as claimed in claim 1, wherein said substrate is made of GaAs and the different layers are made of:

$$Ga_{1-x}Al_xAs$$

wherein x is comprised between 0 and 1.

5. Diode as claimed in claim 3, wherein said photoreceptive layer is made of Ga As, said optical confinement layer is made of $Ga_{0.7}Al_{0.3}As$, said photoemissive layer is made of $Ga_{0.93}Al_{0.07}As$ and said another layer is made of $Ga_{0.7}Al_{0.3}As$.

* * * * *